US010936044B2

(12) United States Patent
Bacchus et al.

(10) Patent No.: US 10,936,044 B2
(45) Date of Patent: Mar. 2, 2021

(54) QUALITY OF SERVICE BASED MEMORY THROTTLING

(71) Applicant: HEWLETT PACKARD ENTERPRISE DEVELOPMENT LP, Houston, TX (US)

(72) Inventors: Reza Bacchus, Spring, TX (US); Melvin Benedict, Magnolia, TX (US); Eric L Pope, Tomball, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 206 days.

(21) Appl. No.: 16/064,050

(22) PCT Filed: Dec. 21, 2015

(86) PCT No.: PCT/US2015/066991
§ 371 (c)(1),
(2) Date: Jun. 20, 2018

(87) PCT Pub. No.: WO2017/111887
PCT Pub. Date: Jun. 29, 2017

(65) Prior Publication Data
US 2019/0018474 A1    Jan. 17, 2019

(51) Int. Cl.
*G06F 1/00*    (2006.01)
*G06F 1/3234*    (2019.01)
(Continued)

(52) U.S. Cl.
CPC ............ *G06F 1/3275* (2013.01); *G06F 1/206* (2013.01); *G06F 1/3206* (2013.01);
(Continued)

(58) Field of Classification Search
CPC .... G06F 1/3206; G06F 1/3225; G06F 1/3275; G06F 1/206; G06F 11/3062;
(Continued)

(56) References Cited

U.S. PATENT DOCUMENTS 5,127,014 A    6/1992 Raynham
5,566,304 A    10/1996 Regal
(Continued)

FOREIGN PATENT DOCUMENTS

WO    WO-2008014494 A2    1/2008
WO    WO-2009026196 A1    2/2009
(Continued)

OTHER PUBLICATIONS

International Preliminary Report on Patentability received for PCT Patent Application No. PCT/US2014/047760, dated Feb. 2, 2017, 6 pages.
(Continued)

*Primary Examiner* — Nitin C Patel
(74) *Attorney, Agent, or Firm* — Hewlett Packard Enterprise Patent Department

(57) ABSTRACT

An example memory device comprises at least one memory region; and a controller to determine exceeding of a throttling threshold and to throttle processing of access requests for the at least one memory region.

7 Claims, 8 Drawing Sheets

(51) Int. Cl.
  *G06F 1/20* (2006.01)
  *G06F 1/3225* (2019.01)
  *G06F 1/3206* (2019.01)
  *G06F 11/30* (2006.01)
  *G06F 13/16* (2006.01)
  *G11C 7/04* (2006.01)

(52) U.S. Cl.
  CPC ........ *G06F 1/3225* (2013.01); *G06F 11/3062* (2013.01); *G06F 13/1689* (2013.01); *G06F 2201/81* (2013.01); *G06F 2213/16* (2013.01); *G11C 7/04* (2013.01); *Y02D 10/00* (2018.01)

(58) Field of Classification Search
  CPC ... G06F 2210/81; G06F 2213/16; G11C 7/04; Y02D 10/13; Y02D 10/14
  See application file for complete search history.

(56) References Cited

U.S. PATENT DOCUMENTS

| | | |
|---|---|---|
| 5,987,555 A | 11/1999 | Alzien et al. |
| 6,199,131 B1 | 3/2001 | Melo et al. |
| 6,349,390 B1 | 2/2002 | Dell et al. |
| 6,742,074 B2 | 5/2004 | Jeddeloh |
| 6,832,254 B1 | 12/2004 | Scoggins et al. |
| 7,159,082 B1 | 1/2007 | Wade |
| 7,266,710 B1 | 9/2007 | Cooper |
| 7,458,000 B2 | 11/2008 | Gorman et al. |
| 8,122,265 B2 | 2/2012 | Radhakrishnan et al. |
| 8,161,356 B2 | 4/2012 | Bains et al. |
| 8,713,252 B1 | 4/2014 | de la Iglesia et al. |
| 2003/0009721 A1 | 1/2003 | Hsu |
| 2004/0243886 A1 | 12/2004 | Klein |
| 2004/0267409 A1* | 12/2004 | De Lorenzo ........ G06F 13/1668 700/299 |
| 2005/0055594 A1 | 3/2005 | Doering et al. |
| 2008/0082766 A1 | 4/2008 | Okin |
| 2008/0177929 A1 | 7/2008 | Gower |
| 2008/0195831 A1 | 8/2008 | Tsukamoto et al. |
| 2009/0070553 A1 | 3/2009 | Wallach et al. |
| 2009/0138733 A1 | 5/2009 | Winick et al. |
| 2012/0317352 A1 | 12/2012 | Kang et al. |
| 2012/0331207 A1* | 12/2012 | Lassa .................... G06F 3/0625 711/103 |
| 2013/0054901 A1 | 2/2013 | Biswas et al. |
| 2013/0139008 A1 | 5/2013 | Kalyanasundharam |
| 2013/0275665 A1* | 10/2013 | Saraswat ................ G06F 12/00 711/106 |
| 2014/0208071 A1 | 7/2014 | Jeong et al. |
| 2014/0208144 A1 | 7/2014 | Ma |
| 2014/0281810 A1 | 9/2014 | Gifford et al. |
| 2015/0135183 A1 | 5/2015 | Kipp |
| 2016/0085458 A1* | 3/2016 | Skandakumaran ... G06F 3/0625 710/313 |

FOREIGN PATENT DOCUMENTS

| | | |
|---|---|---|
| WO | 2012/040510 A1 | 3/2012 |
| WO | WO-2013028849 A1 | 2/2013 |
| WO | WO-2015116077 A1 | 8/2015 |
| WO | WO-2015116078 A1 | 8/2015 |
| WO | WO-2015116079 A1 | 8/2015 |
| WO | WO-2015116080 A1 | 8/2015 |
| WO | WO-2016014046 | 1/2016 |

OTHER PUBLICATIONS

Ibrahim Hur, "A Comprehensive Approach to DRAM Power Management," Conference: High Performance Computer Architecture, Mar. 2008, IEEE 14th International Symposium, 12 pages.
Intel Enterprise Platforms and Services Division, Intel Server Board S5500BC—Technical Product Specification, Revision 1.8, Jun. 2011 (162 pages).
Intel White Paper, The Intel Xeon Processor 7500 Series, Advanced Reliability for Intel Xeon Processor-based Servers, Version 1.0, Mar. 2010 (12 pages).
International Search Report & Written Opinion received in PCT Application No. PCT/US2014/047760, dated Mar. 2, 2015, 9 pages.
Manu Awasthi, "Efficient Scrub Mechanisms for Error-Prone Emerging Memories," High Performance Computer Architecture, IEEE 18th Int'l Symposium, Feb. 25-29, 2012, 12 pages.
PCT/ISA/KR, International Search Report and Written Opinion, dated Sep. 19, 2016, PCT/US2015/066991, 12 pages.
PCT/ISA/KR, International Search Report and Written Opinion, dated Jul. 15, 2016, PCT/US2015/055976, 11 pages.
Vo, H., "A Case for OS-friendly Hardware Accelerators," Jul. 29, 2013, 8 pages, http://www.eecs.berkeley.edu/~krste/papers/osaccel-wivosca2013.pdf.

* cited by examiner

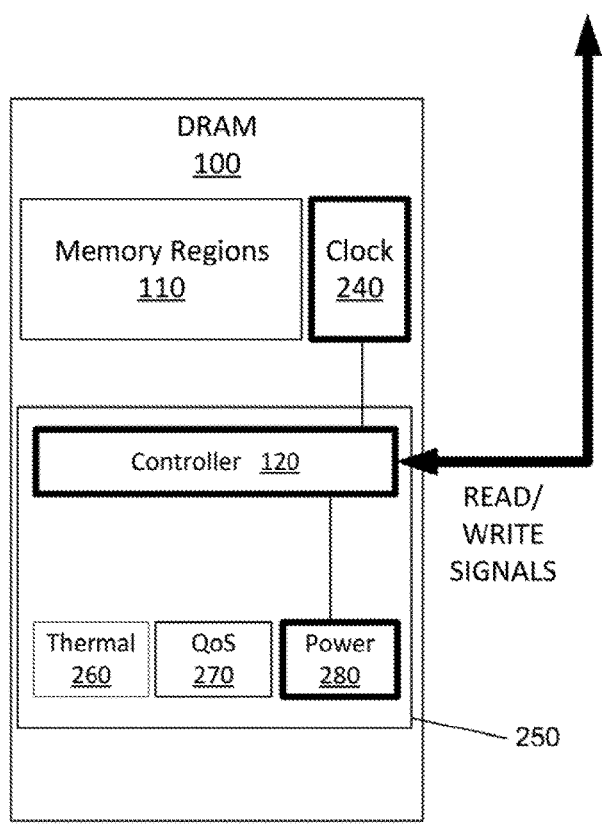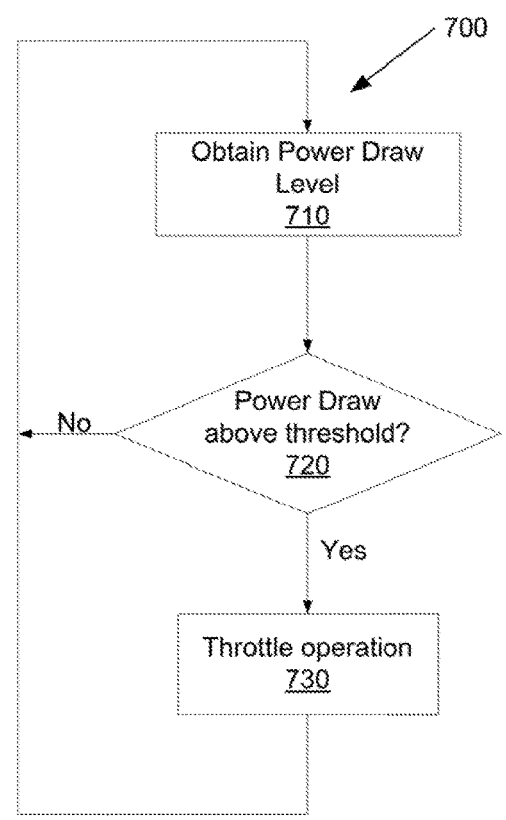
Figure 7A                    Figure 7B

QUALITY OF SERVICE BASED MEMORY THROTTLING

BACKGROUND

Memory devices provide storage of data that may be accessed by a system through a memory controller. Typical systems may include a memory controller communicating with multiple memory devices through a memory bus. The memory controller can send access requests to each memory device to either read data from a particular address of a particular memory device or write data to the memory device.

BRIEF DESCRIPTION OF THE DRAWINGS

For a more complete understanding of various examples, reference is now made to the following descriptions taken in connection with the accompanying drawings in which:

FIGS. 7A and 7B illustrate an example process for throttling based on power draw.

DETAILED DESCRIPTION

Various examples described herein provide for a memory device with the ability to throttle operation of the memory device under certain circumstances. The memory device may include a throttling portion with a controller that can monitor certain parameters and, upon determining that at least one threshold has been exceeded, reduce the rate of processing of memory access requests from a memory controller. The functionality or circuitry to determine the need to throttle and the control of the throttling is embedded within the memory device.

With emerging memory technologies, a particular system may include a memory controller communicating with different types of memory devices. Such systems may give rise to issues related to compatibility and complexity of operation of the memory controller. For example, the memory controller may be required to control various types of devices. Alternatively, the memory devices may be required to be constrained to a protocol which allows a memory controller to fully control operation of the memory device.

In accordance with examples described herein, example memory devices are provided which contain certain functionality within the memory device itself. This allows the memory devices to function with a memory controller with a non-deterministic protocol. Further, the load from the memory bus is significantly reduced by eliminating certain communications between the memory device and the memory controller.

Figure 1:
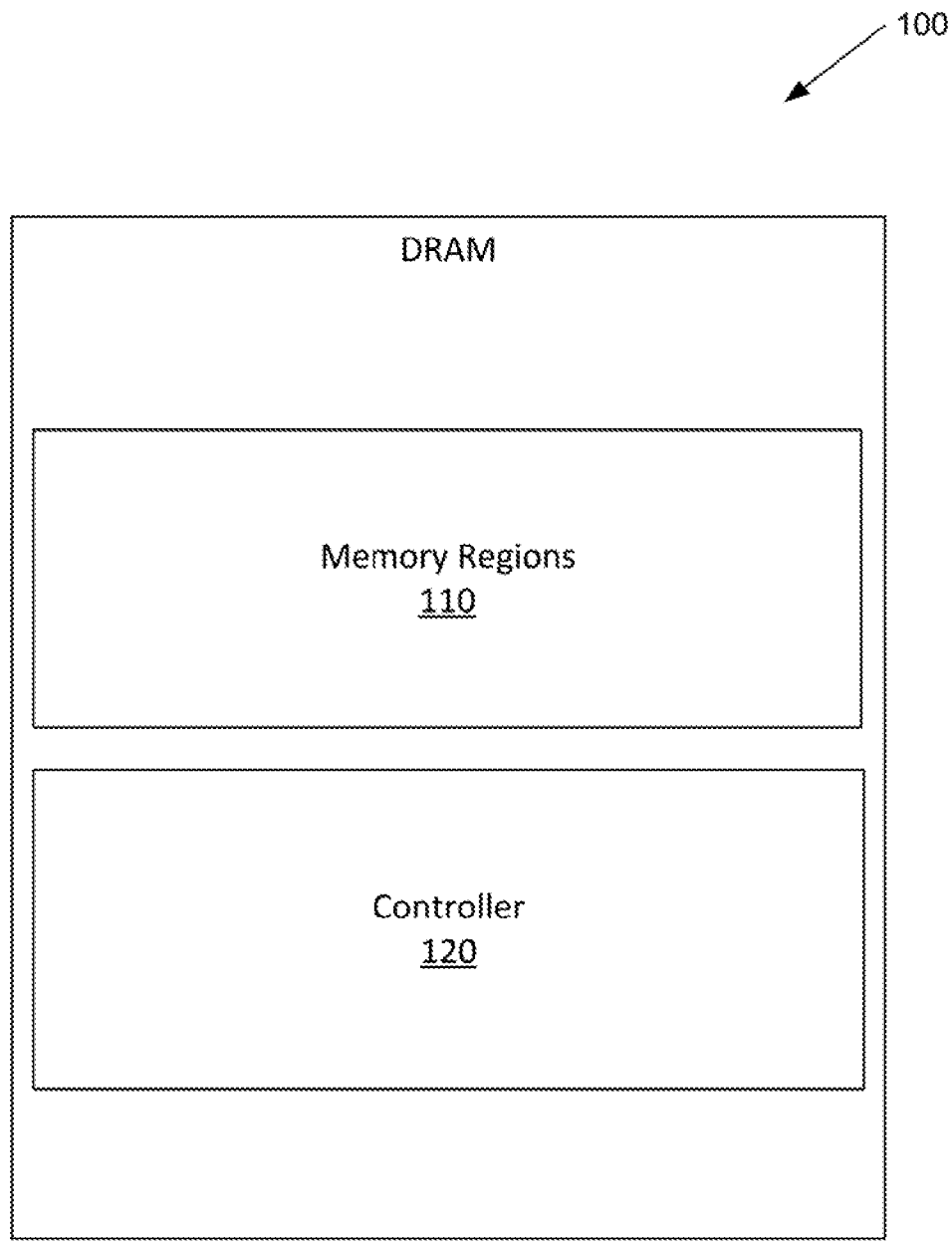
FIG. 1 illustrates an example memory device.

Referring first to FIG. 1, an example memory device is illustrated. The example memory device 100 of FIG. 1 may be a dynamic random-access memory (DRAM) device. As described in greater detail below, example DRAM devices may communicate data to and receive commands from a memory controller through a bidirectional data bus. The example memory device 100 includes at least one memory region 110 for storing of data. The memory regions 110 may store data in locations that are identified by addresses which may be included in the commands received from the memory controller. Various memory devices may include any number of memory regions 110. Further, the size of each memory region 110 may vary in various examples. Of course, the size and number of memory regions 110 determines the storage capacity of the memory device 100.

The example memory device 100 further includes a controller 120 embedded in the memory device 100. In this regard, the embedded controller 120 may be integrally formed or otherwise positioned within the memory device 100. As described with reference to the various examples below, the controller 120 may include hardware, software or firmware to allow the controller 120 to control various operations of the memory device 100, including throttling the operation of the memory device 100. As used herein, "throttling" may refer to reducing the rate of operation of the memory device 100. For example, throttling may include slowing the processing of commands from a memory controller that is external to the memory device. The commands may include requests for access to the memory regions 110, for example, to read data from or write data to the memory regions 110.

Figure 2:
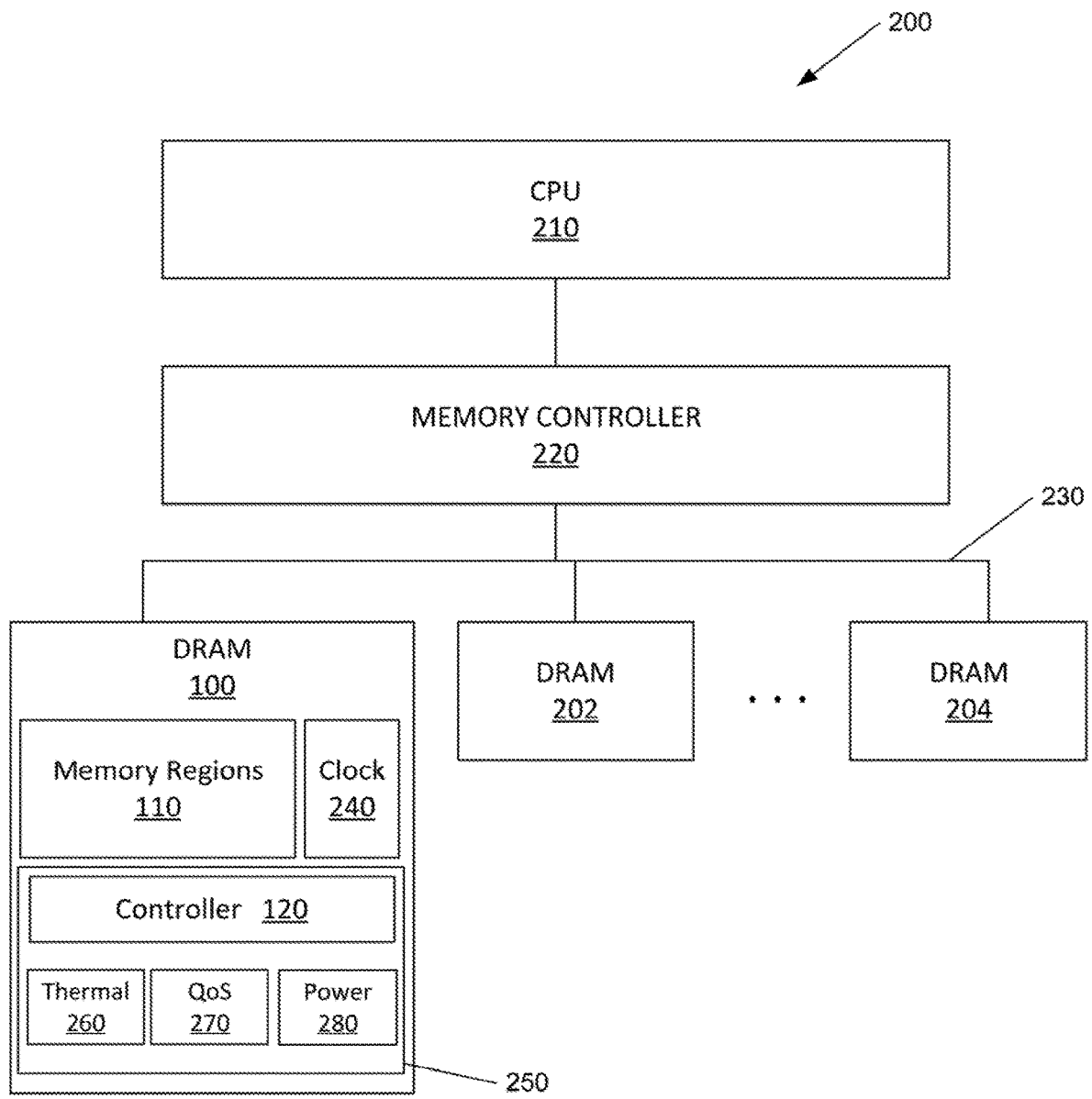
FIG. 2 illustrates an example system with the example memory device of FIG. 1.

Referring now to FIG. 2, an example system 200 with the example memory device 100 of FIG. 1 is illustrated. The example system 200 of FIG. 2 may be implemented in a variety of computer systems. In one example, the system 200 is implemented in a standard server system. The example system 200 includes a central processing unit (CPU) 210 coupled to a memory controller 220. The CPU 210 may execute a variety of commands as may be indicated by firmware or software, for example.

Various commands executed by the CPU 210 may require access to data or other information stored in the memory of the example system 200. In this regard, the example system 200 is provided with various memory systems. The example system 200 of FIG. 2 may include multiple slots for memory devices (e.g., DRAM devices 100, 202, 204) that are coupled to the memory controller 220 through a memory bus 230 (e.g., an address bus). Based on the commands executed by the CPU 210, the memory controller 220 may send a signal on the address bus 230 to access a particular memory device (e.g., DRAM 100) or groups of memory devices 100, 202, 204 installed on various slots coupled to the memory controller 220.

Figure 3:
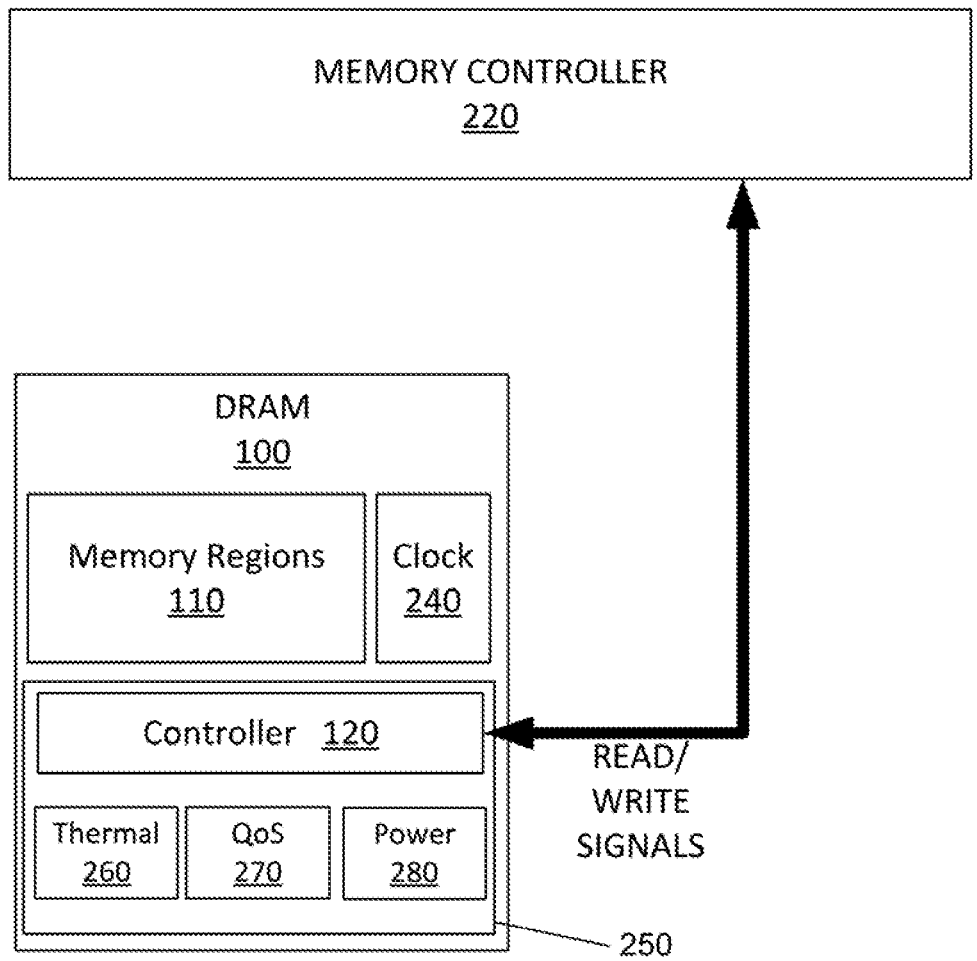
FIG. 3 illustrates an example operation of the memory device of FIG. 1 with an example memory controller.

FIG. 2 illustrates the example memory device 100 of FIG. 1 in greater detail. In addition to the memory regions 110 described above with reference to FIG. 1, the example memory device 100 includes a clock 240. FIG. 2 further illustrates a throttling portion 250 of the example memory device 100. In particular, as illustrated in FIG. 2, the throttling portion 250 of the example memory device 100 includes the controller 120. As noted above, the controller 120 is a part of the example memory device 100 and, in various examples, a part of the throttling portion 250 of the example memory device 100. As illustrated in FIG. 3, the controller 120 of the example memory device 100 may receive read or write signals from the memory controller 220, for example. The read or write signals from the memory controller 220 may include requests for access to certain portions of the memory regions 110 to write data to or read data from the accessed memory regions 110. In this regard, the read or write signals from the memory controller 220 generally include an address corresponding to the location in the memory regions for which access is desired. The address may specify at least one of the memory regions, for example.

The controller 120 of the example memory device 100 may schedule processing of the access requests in the read or write signals from the memory controller 220. In this regard, the example memory device 100 may have a default processing speed that may be a function of the hardware, firmware or software forming the example memory device 100. For example, the default processing speed may be limited by the processing speed of the controller 120. In addition, the controller 120 may limit the speed at which the access requests are processed based on one or more factors. For example, the controller 120 of the example memory device 100 may throttle processing of the access requests upon determining that a throttling threshold has been exceeded. In this regard, the throttling portion 250 of the example memory device 100 includes various portions 260, 270, 280 to facilitate throttling of the example memory device 100. The example portions 260, 270 and 280 are described in greater detail below with reference to FIGS. 5A-7B. In various examples, the controller 120 and the various example portions 260, 270, 280 may be implemented as hardware, software, firmware or a combination thereof.

FIG. 3 illustrates an example operation of the memory device of FIGS. 1 and 2 with the example memory controller 220. As noted above, the controller 120 of the example memory device 100 may receive read or write signals from the memory controller 220 which may include requests for access to certain portions of the memory regions 110. The controller 120 may respond to the read or write signals with, for example, a signal containing data that may be read from the memory region 110 or an acknowledgement of writing of data to the memory region. In accordance with various examples, the read or write signals from the memory controller 220 are not deterministic. In this regard, the timing of the response from the controller 120 to the signals from the memory controller 220 is independent of the memory controller 220 and the signals themselves. The timing of the response is determined internally by the example memory device 100 (e.g., the controller 120).

Figure 4:
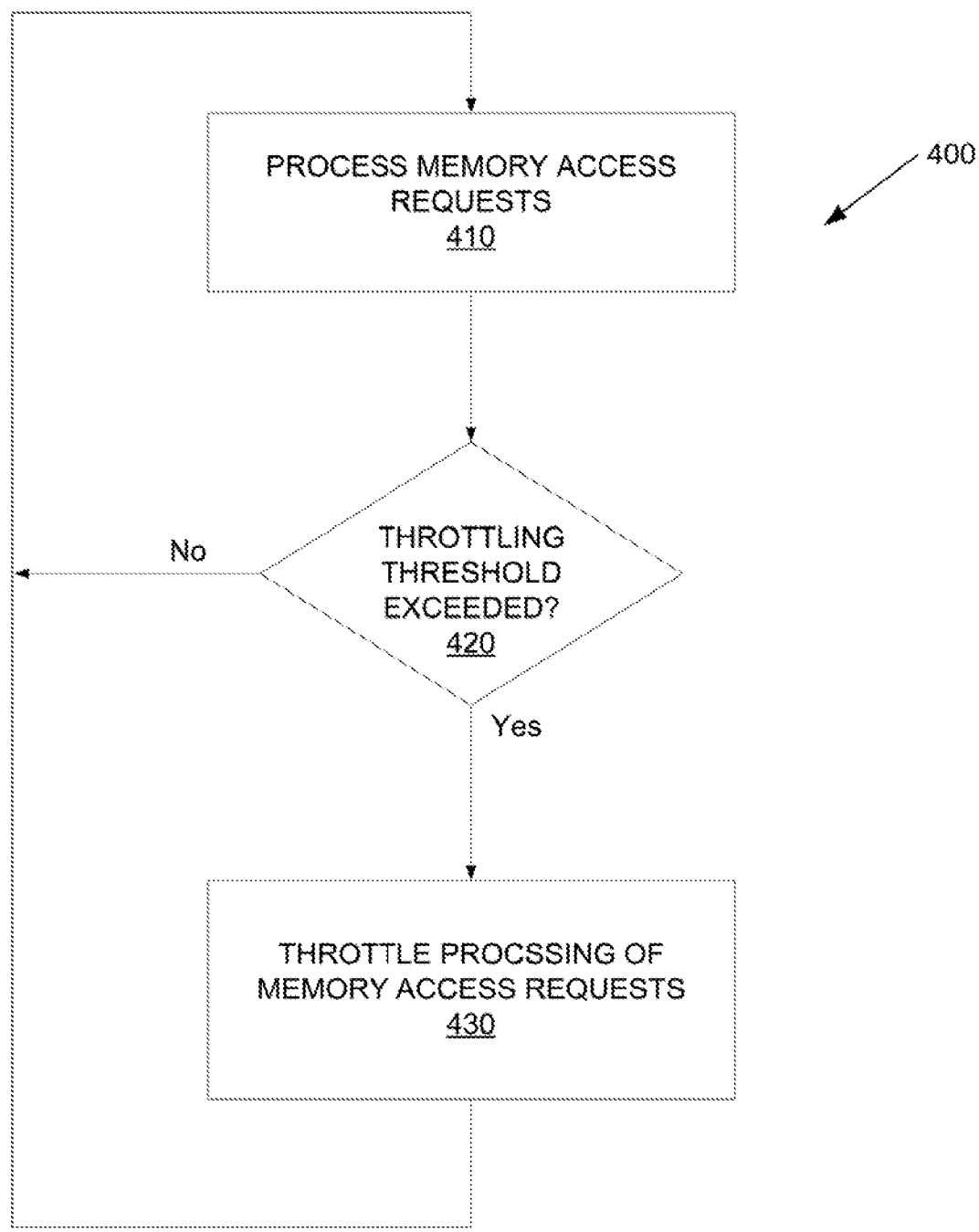
FIG. 4 illustrates an example process for throttling processing of memory requests by the example memory device of FIG. 1.

Referring now to FIG. 4, an example process 400 is illustrated for throttling processing of memory requests by the example memory device 100 of FIG. 1. The example process 400 may be implemented in the controller 120 of the example memory device 100 described above in FIGS. 1-3. The example process 400 includes processing of memory access requests (block 410). In this regard, as described above, the example memory device 100 may receive read or write signals from the memory controller 220, and the read or write signals may include requests to access the memory regions 110. The processing of the memory access requests may include processing the requested read or write command. In the case of a read request, the controller 120 may retrieve data stored at a memory location specified in the read request and forward the retrieved data to the memory controller 220, for example. In the case of a write request, the controller 120 may access a desired memory location (e.g., in a particular memory region 110) and write data specified in the write request at the desired memory location.

In accordance with the example process 400, the controller 120 determines if a throttling threshold has been exceeded (block 420). The throttling threshold may be a value of any of a variety of parameters, an excess of which warrants throttling the operation of the example memory device 100. The throttling threshold may be a value of a parameter such as a temperature within the example memory device 100, a quality-of-service parameter or a level of power being drawn by the example memory device 100, for example. The controller 120 of the example memory device 100 may determine dial a throttling threshold has been exceeded by regularly or continuously monitoring the associated parameter.

If the controller determines that no throttling threshold has been exceeded, the process 400 returns to block 410 and continues processing memory requests at the current speed, for example. The current speed may be the default processing rate or the maximum processing rate of the sample memory device 100.

On the other hand, if the controller 120 determines that at least one throttling threshold has been exceeded, the controller 120 throttles processing of memory access requests from the memory controller 220 (block 430). As noted above, the controller 120 may reduce the rate at which it responds to read or write signals from the memory controller 220. In one example, the controller 120 may hold the read or write signals in a buffer of the memory device 100 in order to reduce the rate of processing of the access requests in the read or write signals.

Figure 5A:
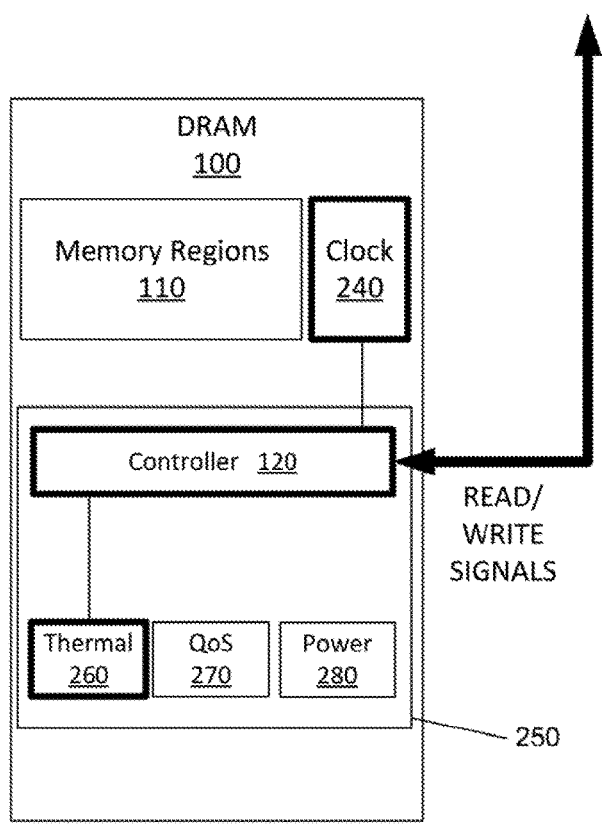
FIGS. 5A and 5B illustrate an example process for throttling based on temperature.
Figure 5B:
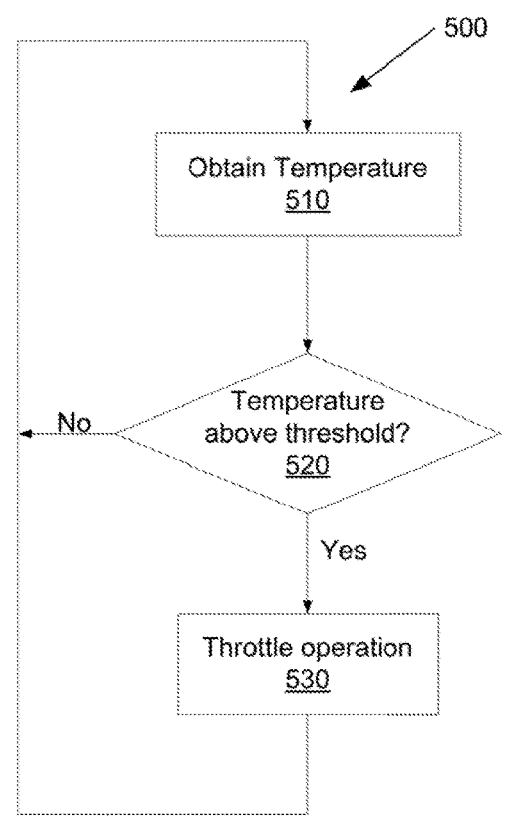

Referring now to FIGS. 5A and 5B, an example of throttling based on temperature is illustrated. Again, the example process 500 of FIG. 5B may be implemented in the controller 120 of the example memory device 100 described above. As illustrated in FIG. 5A, the controller 120 of the example memory device 100 may receive read or write signals from, for example, a memory controller, such as the memory controller 220 illustrated in FIG. 2. The read or write signals may include access request for the memory regions 110 of the example memory device 100. The controller may process the access requests by reading from or writing to a specific location in the memory regions 110.

The controller 120 may regularly or continuously obtain a temperature value of the example memory device 100 (block 510). In this regard, the controller 120 may communicate with a thermal portion 260 of the throttling portion 250. The thermal portion 260 may include circuitry to measure a temperature value or may simply include a trigger to indicate the temperature value has exceeded a predetermined value. Thus, the controller 120 may determine, based on an indication from the thermal portion 260, whether or not a temperature threshold has been exceeded (block 520).

If the temperature threshold has not been exceeded, the process 500 returns to block 510, and the controller 120 continues to obtain temperature values. In this regard, the controller 120 may continue to process access requests at a current rate.

On the other hand, if an indication from the thermal portion 260 indicates that the temperature threshold has been exceeded, the controller 120 may throttle operation of the memory device (block 530). As noted above, throttling operation of the memory device may include reducing the rate of processing of the access requests. In this regard, the memory controller may access the clock 240 of the example memory device 100 to control the rate at which the access requests are processed. The reduced rate may be a single predetermined rate that is lower than the maximum speed of the memory device. In other examples, the reduced rate may be dependent on the determined temperature of the memory device. For example, the controller 120 may reduce the rate a larger amount for a higher temperature value.

Figures 6A, 6B:
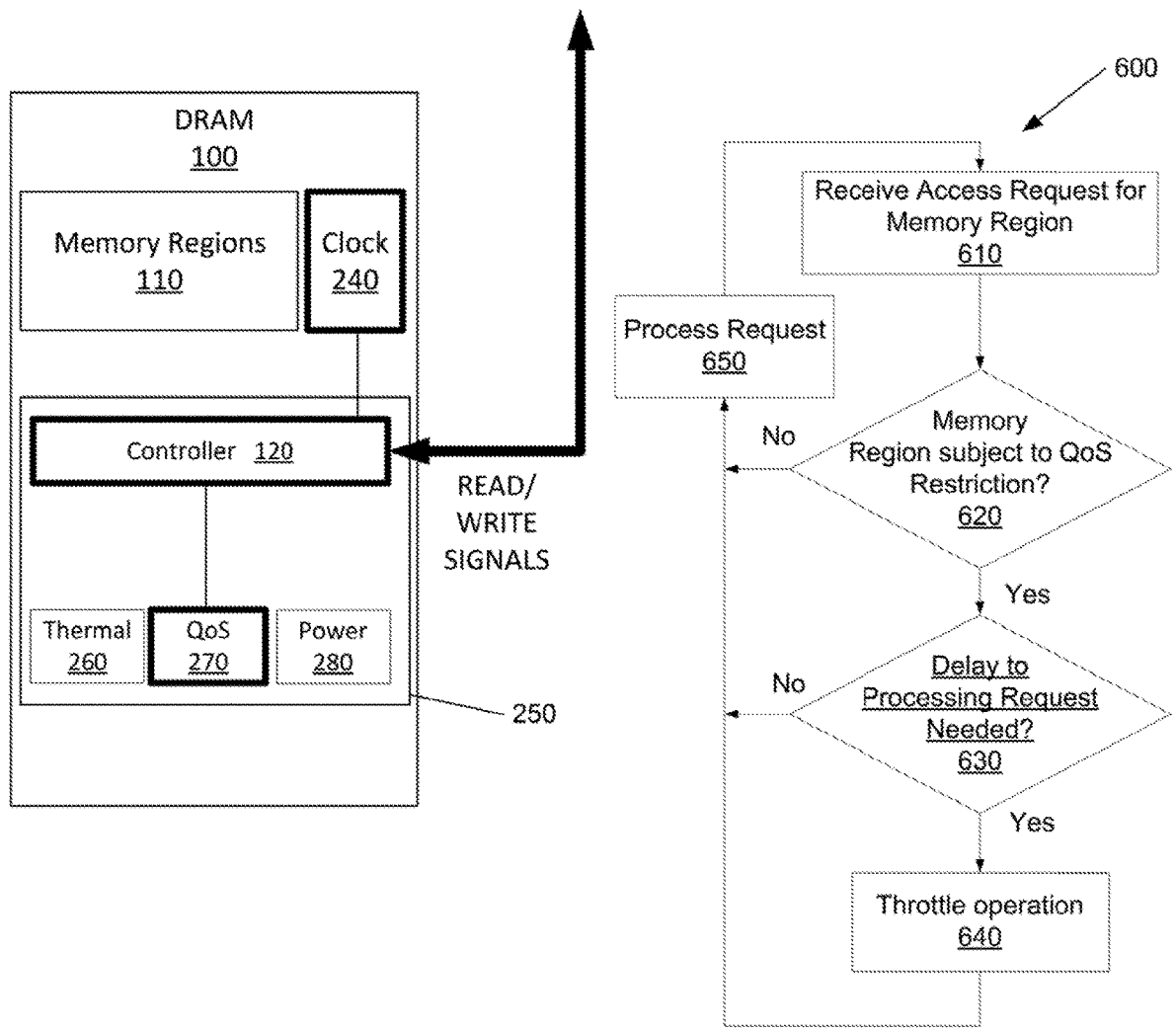
FIGS. 6A and 6B illustrate an example process for throttling based on quality of service.

Referring now to FIGS. 6A and 6B, an example of throttling based on quality of service (QoS) is illustrated. In various examples, QoS for the example memory device 100 or a particular memory region 110 of the example memory device may be determined by one or more components or factors. Such components or factors may limit the frequency at which the example memory device 100 or a particular memory region 110 is accessed. For example, the QoS may be determined by the maximum bandwidth of the controller 120 of the example memory device 100. In further examples, the QoS may be dependent on the arrangement of the memory device 100 with respect to the memory controller 220 or the CPU 210 illustrated in the example of FIG. 2. In one example, the example memory device 100 may be provided to operate in a non-uniform memory access (NUMA) configuration. In a NUMA configuration, the example memory device 100 may be accessible by a local processor (e.g., the CPU 210 of FIG. 2) or a remote processor (not shown). The QoS of the example memory device 100 and various memory regions 110 may be different for the local processor than for the remote processor.

The example process 600 of FIG. 6B may be implemented in the controller 120 of the example memory device 100 described above. As illustrated in FIG. 6A, the controller 120 of the example memory device 100 may receive read or write signals as described above. The read or write signals may include requests for access to a specific memory region of the memory regions 110 (block 610). As illustrated in FIG. 6A, the controller 120 may communicate with a QoS portion 270 of the example memory device 100. The QoS portion 270 may include QoS restrictions on one or more memory regions 110. In one example, the QoS portion 270 may include a different restriction for each memory region of the memory regions 110.

Upon receiving a memory request for a memory region, the controller 120 may determine whether the requested memory region is subject to a QoS restriction (block 620). In this regard, the controller 120 may access the QoS portion 270 and obtain any restriction applicable to the requested memory region. If the requested memory region is not subject to any QoS restriction, the process may continue to block 650, and the controller may process the access request. On the other hand, at block 620, if the controller 120 determines that the requested memory region is subject to a QoS restriction, the controller determines whether a delay in processing the access request is needed (block 630).

A QoS restriction may indicate that a delay is needed by imposing a limit on the frequency of access requests processed for a memory region. For example, a memory region may include a QoS restriction indicating that an access request for that memory region may be processed once every n clock cycles. In this regard, the controller 120 may reset a counter for the particular memory region at n each time the memory region is accessed. The counter is decremented by one for each cycle of the clock 240 until it reaches zero. The controller 120 may not allow access to the memory region until the counter has reached zero. The value of n may be different for each memory region, and the controller 120 may update counters for each memory region at each clock cycle.

Thus, at block 630, the controller 120 may determine that a delay in processing the access request is needed if the counter for the requested is greater than zero. If, at block 630, the controller 120 determines that no delay is needed (e.g., the counter is at zero), the process proceeds to block 650, and the controller processes the access request. On the other hand, if the controller 120 determines that a delay is needed in processing the access request (e.g., the counter is greater than zero), the controller 120 throttles operation of the example memory device 100 (block 640). In this regard, throttling of the example memory device 100 may include delaying of access requests for a particular memory region. In one example, the delaying of access requests for one memory region may nevertheless allow processing of requests for other memory regions, thus allowing out-of-order processing of access requests. For example, an access request for a throttled memory region may be buffered, and a subsequent access request for another memory region may be processed.

Referring now to FIGS. 7A and 7B, an example of throttling based on power draw is illustrated. Again, the example process 700 of FIG. 7B may be implemented in the controller 120 of the example memory device 100 described above. As illustrated in FIG. 7A and as described above, the controller 120 of the example memory device 100 may receive read or write signals.

The controller 120 may regularly or continuously obtain a power draw value of the example memory device 100 (block 710). In this regard, the controller 120 may communicate with a power portion 280 of the throttling portion 250. The power portion 280 may include circuitry to measure the amount of power being drawn by the example memory device 100. In some examples, the power portion 280 may not measure the precise amount of power being drawn buy may instead include a trigger to indicate that the level of power being drawn by the example memory device 100 has exceeded a predetermined value. Thus, the controller 120 may determine, based on an indication from the power portion 280, whether or not a power draw threshold has been exceeded (block 720).

If the power draw threshold has not been exceeded, the process 700 returns to block 710, and the controller 120 continues to obtain an indication of the power draw level. In this regard, the controller 120 may continue to process access requests at a current rate.

On the other hand, if an indication from the power portion 280 indicates that a power draw threshold has been exceeded, the controller 120 may throttle operation of the memory device (block 730). As noted above, throttling operation of the memory device may include reducing the rate of processing of the access requests. In this regard, the memory controller may access the clock 240 of the example memory device 100 to control the rate at which the access requests are processed. Again, the reduced rate may be either a single reduced rate or a function of the power draw level. In this regard, a larger power draw may result is a lower rate of processing of access requests.

Figure 8:
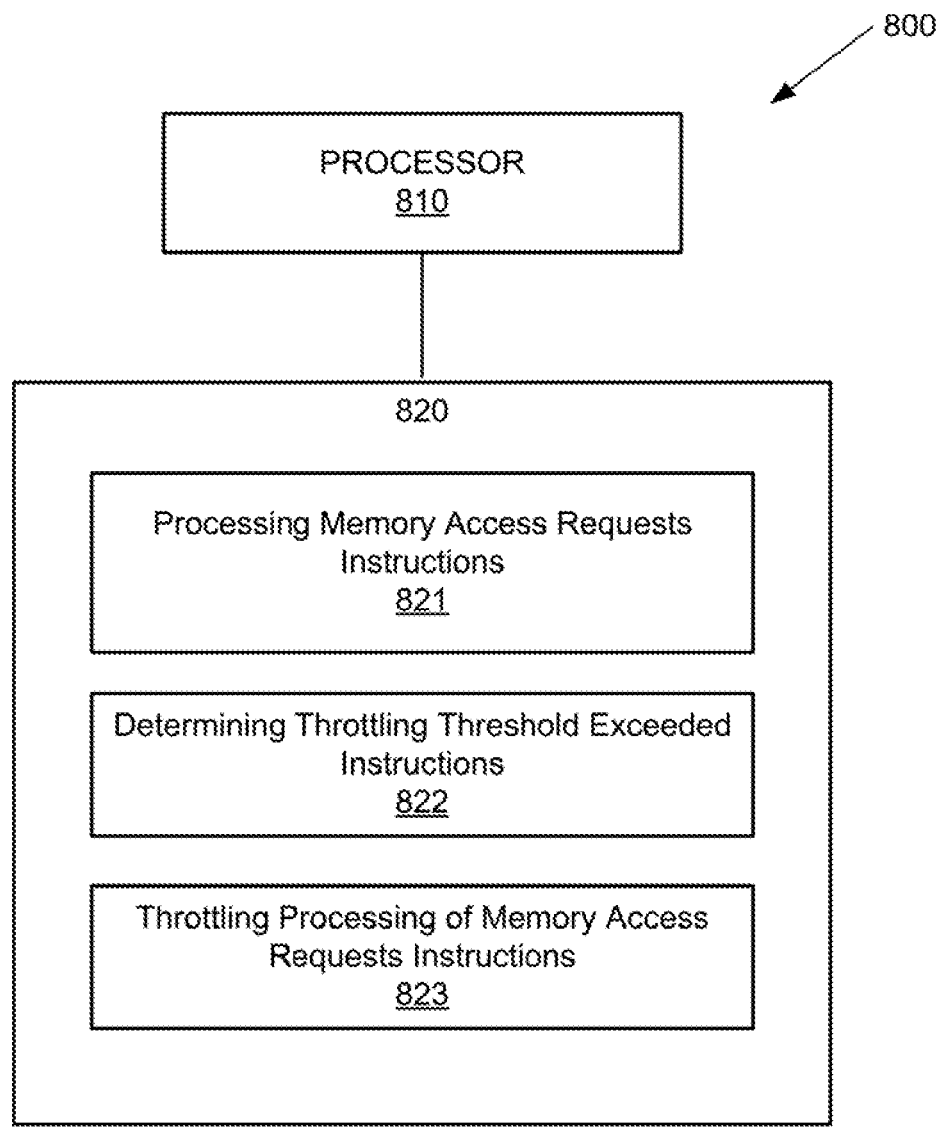
FIG. 8 illustrates a block diagram of an example system with a computer-readable storage medium including instructions executable by a processor for throttling a memory device.

FIG. 8 illustrates a block diagram of an example system with a computer-readable storage medium including example instructions executable by a processor to provide throttling of a memory device. The system 800 includes a processor 810 and a computer-readable storage medium 820. The computer-readable storage medium 820 includes example instructions 821-823 executable by the processor 810 to perform various functionalities described herein. As noted above, the example instructions 821-823 may be executable by a processor 810 that is embedded within a memory device, such as the controller 120 of the example memory device 100 described above.

The example instructions include receiving memory access requests instructions 821. The instructions 821 cause the processor 810 to receive read or write signals from an external memory controller, such as the memory controller 220 of FIG. 2. In this regard, the memory controller is external to the memory device, while the processor 810 is embedded within the memory device.

The example instructions 822 cause the processor 810 to determine a throttling threshold has been exceeded. As described above, in various examples the throttling threshold may be associated with a temperature value of the memory device, a quality-of-service restriction or a power draw level of the memory device. Further, example instructions 823 cause the processor 810 to throttle processing of the memory access requests.

Thus, providing throttling functionality within the memory device may reduce the communication between the memory device and the memory controller to read or write signals. In this regard, issues related to compatibility between the memory controller and the memory device, as well as between the memory device and other memory devices on the same memory bus, may be reduced or eliminated.

The various examples set forth herein are described in terms of example block diagrams, flow charts and other illustrations. Those skilled in the art will appreciate that the illustrated examples and their various alternatives can be implemented without confinement to the illustrated examples. For example, block diagrams and their accompanying description should not be construed as mandating a particular architecture or configuration.

What is claimed is:

1. A method, comprising:
   receiving, by a memory device, a memory access request from a memory controller for access to at least one memory region of the memory device;
   determining, by a controller of the memory device, when a throttling threshold associated with the memory device has been exceeded; and
   throttling processing of the memory access requests, wherein the throttling includes reducing a rate of processing of the memory access request for the at least one memory region; wherein the determining when the throttling threshold has been exceeded comprises:
   identifying a first memory region of the at least one memory region associated with the memory access request;
   determining that the first memory region is subject to a quality-of-service (QoS) restriction; and
   determining if the QoS restriction dictates a delay in processing the memory access request.

2. The method of claim 1, wherein the memory device is a dynamic random access memory (DRAM) device.

3. The method of claim 1, wherein the determining when the throttling threshold has been exceeded comprises:
   obtaining a temperature of a portion of the memory device; and
   determining that the temperature is above a temperature threshold.

4. The method of claim 1, wherein the determining when the throttling threshold has been exceeded comprises:
   obtaining a power draw level for the memory device; and
   determining that the power draw level is above a power draw threshold.

5. A non-transitory computer-readable medium encoded with instructions executable by a processor of a computing system, the computer-readable storage medium comprising instructions to:
   receive a memory access request from a memory controller for access to at least one memory region of the memory device;
   determine when a throttling threshold associated with the memory device has been exceeded; and
   throttling processing of the memory access requests, wherein the throttling includes reducing a rate of processing of the memory access request for the at least one memory region; wherein the determining when the throttling threshold has been exceeded comprises:
   identifying a first memory region of the at least one memory region associated with the memory access request;
   determining that the first memory region is subject to a quality-of-service (QoS) restriction; and
   determining the QoS restriction dictates a delay in processing the memory access request.

6. The non-transitory computer-readable medium of claim 5, wherein the determining when the throttling threshold has been exceeded comprises:
   obtaining a temperature of a portion of the memory device; and
   determining that the temperature is above a temperature threshold.

7. The non-transitory computer-readable medium of claim 5, wherein the determining when the throttling threshold has been exceeded comprises:
   obtaining a power draw level for the memory device; and
   determining that the power draw level is above a power draw threshold.

* * * * *